(12) United States Patent
Tsukuta

(10) Patent No.: US 11,709,207 B2
(45) Date of Patent: Jul. 25, 2023

(54) POWER SUPPLY DEVICE AND DETERIORATION DETERMINATION METHOD OF POWER SUPPLY DEVICE

(71) Applicant: FUJI ELECTRIC CO., LTD., Kawasaki (JP)

(72) Inventor: Motohiro Tsukuta, Kobe (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 255 days.

(21) Appl. No.: 17/159,663

(22) Filed: Jan. 27, 2021

(65) Prior Publication Data

US 2021/0293894 A1    Sep. 23, 2021

(30) Foreign Application Priority Data

Mar. 18, 2020  (JP) .................. 2020-048303

(51) Int. Cl.
| | |
|---|---|
| *G01R 31/42* | (2006.01) |
| *H02M 5/458* | (2006.01) |
| *H02M 3/335* | (2006.01) |
| *H02M 1/08* | (2006.01) |
| *H02M 1/00* | (2006.01) |

(52) U.S. Cl.
CPC ............. *G01R 31/42* (2013.01); *H02M 1/08* (2013.01); *H02M 3/33507* (2013.01); *H02M 5/4585* (2013.01); *H02M 1/0009* (2021.05)

(58) Field of Classification Search
CPC ............... G05B 15/02; G05B 19/0423; G05B 19/0428; G05B 23/02
See application file for complete search history.

(56) References Cited

U.S. PATENT DOCUMENTS

| | | | | |
|---|---|---|---|---|
| 2010/0208501 A1* | 8/2010 | Matan | ....................... | H02J 3/50 |
| | | | | 700/297 |
| 2011/0211375 A1* | 9/2011 | Uno | ..................... | H02M 1/4225 |
| | | | | 363/74 |
| 2014/0372050 A1* | 12/2014 | Kanda | ................... | G01R 31/64 |
| | | | | 702/57 |
| 2016/0126040 A1* | 5/2016 | Huang | ..................... | H02H 3/00 |
| | | | | 307/31 |
| 2017/0129364 A1* | 5/2017 | Cui | ........................ | B60L 15/002 |

FOREIGN PATENT DOCUMENTS

| | | |
|---|---|---|
| EP | 3474029 A1 | 4/2019 |
| JP | 2018-044938 A | 3/2018 |
| JP | 6293388 B1 | 3/2018 |

* cited by examiner

*Primary Examiner* — Jermele M Hollington
*Assistant Examiner* — Temilade S Rhodes-Vivour
(74) *Attorney, Agent, or Firm* — Manabu Kanesaka

(57) ABSTRACT

A power supply device includes a controller configured to output, to a power converter, a command value to control at least one of a voltage or a current of power output from the power converter, and acquire a measurement value measured by a measurement unit. The controller is configured to, while power conversion operation is being performed by the power converter, change the command value and determine a deterioration of the power converter based on a mode of a change in the measurement value measured by the measurement unit due to a change in the command value.

16 Claims, 7 Drawing Sheets

FIG.9

|  | C1 | C2a | C2b |
|---|---|---|---|
| FEATURE AMOUNT | 1.52 | 40.53 | 0.02 |
| REFERENCE FEATURE AMOUNT | 1.93 | 42.19 | 1.24 |
| RATIO OF CHANGE | −21% | −4% | −98% |
| THRESHOLD | ±20% | ±10% | ±50% |
| COMPARISON RESULT | ABNORMAL | NORMAL | ABNORMAL |

FIG.10

DETERIORATION DETERMINATION RESULTS

CONVERTER   NORMAL

CHOPPER     ABNORMAL

INVERTER    NORMAL

CHOPPER UNIT HAS PROBABLY DETERIORATED
PLEASE REPAIR OR REPLACE

POWER SUPPLY DEVICE AND DETERIORATION DETERMINATION METHOD OF POWER SUPPLY DEVICE

CROSS-REFERENCE TO RELATED APPLICATION

The present application claims priority of Japanese Patent Application No. 2020-048303 filed Mar. 18, 2020, the disclosure of which is hereby incorporated by reference.

BACKGROUND OF THE INVENTION

Field of the Invention

The present invention relates to a power supply device and a deterioration determination method of a power supply device.

Description of the Background Art

A monitoring system that monitors the deterioration and abnormality of an electrical facility is known in general, as disclosed in Japanese Patent Laid-Open No. 2018-044938, for example.

A monitoring system described in Japanese Patent Laid-Open No. 2018-044938 detects sound waves emitted by a device in an electrical facility and diagnoses the deterioration or abnormality of the device based on the waveform of the detected sound waves. This monitoring system includes an acoustic sensor that detects the sound waves emitted by the device including a transformer or an inverter in the electrical facility, and a monitoring device main body that diagnoses the deterioration or abnormality of the device in the electrical facility based on the detected sound waves. The monitoring device main body includes a storage unit and a comparison and determination unit. The storage unit stores the waveform of sound waves during normal operation of the electrical facility. Furthermore, the storage unit stores a correspondence relationship between the type of a device and a frequency at which an abnormality occurs for each device in the electrical facility. The comparison and determination unit compares the waveform of the sound waves detected by the acoustic sensor with the waveform of the sound waves in a normal state stored in the storage unit. Furthermore, the comparison and determination unit determines whether or not the waveform of the detected sound waves is different from the waveform of the sound waves in the normal state beyond a predetermined width. When determining that the waveform of the detected sound waves is different from the waveform in the normal state, the comparison and determination unit outputs a command to issue an alarm.

However, in the monitoring system described in Japanese Patent Laid-Open No. 2018-044938, the deterioration is determined based on the sound waves emitted by the electrical facility, and thus it is necessary to newly provide the acoustic sensor that detects the sound waves emitted by the device in the electrical facility. Furthermore, in order to determine the deterioration, it is necessary to newly provide the monitoring device main body that diagnoses the deterioration or abnormality of the device in the electrical facility based on the detected sound waves. Therefore, in the monitoring system described in Japanese Patent Laid-Open No. 2018-044938, it is necessary to provide a new device configuration in order to determine the deterioration of the device in the electrical facility (power supply device), and thus the device configuration disadvantageously becomes complex.

SUMMARY OF THE INVENTION

The present invention has been proposed in order to solve the aforementioned problem, and an object of the present invention is to provide a power supply device and a deterioration determination method of a power supply device capable of determining the deterioration while significantly reducing or preventing a complex device configuration.

In order to attain the aforementioned object, a power supply device according to a first aspect of the present invention includes a power converter that performs power conversion operation to convert input power, a measurement unit that measures at least one of a voltage or a current of power output from the power converter, and a controller configured to output, to the power converter, a command value to control at least one of the voltage or the current of the power output from the power converter, and acquire a measurement value measured by the measurement unit. The controller is configured to, while the power conversion operation is being performed by the power converter, change the command value and determine a deterioration of the power converter based on a mode of a change in the measurement value measured by the measurement unit due to a change in the command value.

In the power supply device according to the first aspect of the present invention, as described above, the command value is changed while the power conversion operation is being performed by the power converter. Furthermore, the deterioration of the power converter is determined based on the mode of the change in the measurement value of at least one of the voltage or the current of the power output from the power converter due to the change in the command value. Accordingly, the deterioration of the power converter is determined based on the mode of the change in the measurement value due to the change in the command value, and thus the deterioration can be determined under control of the controller that controls the power conversion operation. Therefore, the deterioration can be determined without providing a new device configuration. Consequently, the deterioration can be determined while a complex device configuration is significantly reduced or prevented. In addition, the deterioration is determined based on the mode of the change in the measurement value due to the change in the command value, and thus it is possible to determine a minor failure and deterioration in which no abnormality is observed when a constant output is performed by a constant command value without changing the command value.

In the aforementioned power supply device according to the first aspect, the mode of the change in the measurement value preferably includes a state of a response waveform of the measurement value due to the change in the command value, and the controller is preferably configured to determine the deterioration of the power converter based on the state of the response waveform of the measurement value due to the change in the command value. Accordingly, the feature points of the mode of the change in the measurement value can be acquired from the shape of the response waveform, for example, based on the state of the response waveform of the measurement value due to the change in the command value. Therefore, unlike a case in which a numerical value of the measurement value at one point (pinpoint) is acquired for a mode of the change in the command value to determine the deterioration, the feature points of the mode of the change can be easily acquired based on the state of the response waveform. Consequently, the change in the measurement value due to the deterioration can be easily acquired based on the state of the response waveform of the measurement value due to the change in the command value, and thus the deterioration can be easily determined.

In this case, the controller is preferably configured to determine the deterioration of the power converter based on responsiveness of the response waveform including at least one of a response time of the response waveform of the measurement value due to the change in the command value or a change amount of the measurement value in the response waveform of the measurement value due to the change in the command value. Accordingly, even when there is a minor failure or deterioration that does not appear in the output and operation of the power supply device, it is possible to determine a deterioration in which an abnormality appears in the responsiveness of the response waveform including at least one of the response time of the response waveform of the measurement value or the change amount of the measurement value in the response waveform. When a capacitor or a reactor, for example, of the power converter deteriorates, changes such as shortening of the response time and a difference in the magnitude of the change amount of the measurement value from the normal state appear in the responsiveness of the response waveform even when there is no change in the output value during operation. Therefore, the deterioration is determined based on the responsiveness of the response waveform such that it is possible to easily determine the minor failure and deterioration of the capacitor or the reactor of the power converter.

In this case, the response time of the response waveform preferably includes at least one of a value of the response time from a timing at which the command value is changed to a timing at which the change in the measurement value is maximized, a value of the response time from the timing at which the command value is changed to a timing at which the change in the measurement value becomes second largest, or a value of the response time from the timing at which the command value is changed to a timing at which a difference between the measurement value changed due to the change in the command value and the changed command value becomes 5% or less of a change amount of the command value. Accordingly, at least one of the response time from the timing at which the command value is changed to the timing at which the change in the measurement value is maximized, the value of the response time from the timing at which the command value is changed to the timing at which the change in the measurement value becomes second largest, or the value of the response time from the timing at which the command value is changed to the timing at which the difference between the measurement value changed due to the change in the command value and the changed command value becomes 5% or less of the change amount of the command value can be acquired as the response time of the response waveform. When the capacitor or the reactor, for example, of the power converter deteriorates, the response time from the timing at which the command value is changed to the timing at which the change in the measurement value is maximized, the response time from the timing at which the command value is changed to the timing at which the change in the measurement value becomes second largest, and the response time from the timing at which the command value is changed to the timing at which the difference between the measurement value and the command value becomes 5% or less of the change amount of the command value are different in value from those in a case in which there is no deterioration. Therefore, at least one of the response time from the timing at which the command value is changed to the timing at which the change in the measurement value is maximized, the response time from the timing at which the command value is changed to the timing at which the change in the measurement value becomes second largest, or the response time from the timing at which the command value is changed to the timing at which the difference between the measurement value and the command value becomes 5% or less of the change amount of the command value is acquired such that the deterioration of the power converter can be easily determined.

In the aforementioned power supply device in which the deterioration of the power converter is determined based on the responsiveness of the response waveform, the change amount of the measurement value in the response waveform preferably includes at least one of a maximum value of the change amount of the measurement value due to the change in the command value or a difference value between the changed command value and the measurement value changed due to the change in the command value. Accordingly, at least one of the maximum value of the change amount of the measurement value due to the change in the command value or the difference value between the changed command value and the measurement value changed due to the change in the command value can be acquired as the change amount of the measurement value in the response waveform. When the capacitor or the reactor, for example, of the power converter deteriorates, the maximum value of the change amount of the measurement value and the difference value between the command value and the measurement value are different in value from those in a case in which there is no deterioration. Therefore, at least one of the maximum value of the change amount of the measurement value or the difference value between the command value and the measurement value is acquired such that the deterioration of the power converter can be easily determined.

In the aforementioned power supply device according to the first aspect, the controller is preferably configured to acquire a feature amount of the mode of the change in the measurement value based on the mode of the change in the measurement value due to the change in the command value, and determine the deterioration of the power converter by comparing the acquired feature amount of the mode of the change in the measurement value with a reference feature amount of the mode of the change, which becomes a reference acquired in advance. Accordingly, the deterioration can be determined based on the reference feature amount acquired in advance in the normal state without deterioration. Therefore, the acquired feature amount is compared with the reference feature amount such that the deterioration can be easily determined when there is an abnormality in the acquired feature amount. Consequently, a deterioration can be easily determined when the deterioration occurs.

In this case, the controller is preferably configured to determine the deterioration of the power converter by comparing a ratio of the acquired feature amount to the reference feature amount with a predetermined threshold. Accordingly, even when there is a difference between the acquired feature amount and the reference feature amount, the predetermined threshold is set such that a difference due to a minor failure and deterioration can be discriminated from an accidental difference due to noise etc. Therefore, when the feature amount accidentally acquired due to noise etc. is changed, it is possible to significantly reduce or prevent erroneous determination such that the change is due to deterioration. Consequently, it is possible to save time and effort required for unnecessary component replacement based on an erroneous determination result, for example.

In the aforementioned power supply device in which the deterioration of the power converter is determined by comparing the acquired feature amount of the mode of the change in the measurement value with the reference feature amount of the mode of the change, which becomes a reference acquired in advance, the controller is preferably configured to determine the deterioration of the power converter by comparing the acquired feature amount with the reference feature amount changed depending on a magnitude of the current of the power output from the power converter. The acquired feature amount may be changed depending on the magnitude of the current of the power output from the power converter. Therefore, as in the present invention, the controller is configured to determine the deterioration of the power converter by comparing the acquired feature amount with the reference feature amount changed depending on the magnitude of the current of the power output from the power converter such that even when the feature amount is changed depending on the magnitude of the current of the power output from the power converter, the deterioration can be accurately determined by changing the reference feature amount so as to correspond to the change in the feature amount.

In the aforementioned power supply device according to the first aspect, the power converter preferably includes a converter that converts input AC power into DC power, an inverter that converts input DC power into AC power, and a chopper that converts a voltage of input DC power, the measurement unit preferably measures at least one of a voltage or a current of power output from each of the converter, the inverter, and the chopper, and the controller is preferably configured to output the command values to each of the converter, the inverter, and the chopper, acquire the measurement values corresponding to each of the converter, the inverter, and the chopper, and individually determine a deterioration of each of the converter, the inverter, and the chopper. Accordingly, the deterioration can be individually determined for each of the converter, the inverter, and the chopper, and thus a deteriorated portion can be identified from the converter, the inverter, and the chopper. Therefore, it is possible to identify a deteriorated portion from the power supply device and determine the deterioration, and thus it is possible to repair or replace only the portion determined to be deteriorated based on the determination result. Consequently, when repair or replacement is performed, it is possible to save time and effort required to identify a deteriorated portion. Furthermore, only a deteriorated portion can be repaired or replaced from a plurality of portions, and thus it is possible to effectively significantly reduce or prevent repair or replacement of a normal portion.

In the aforementioned power supply device according to the first aspect, the controller is preferably configured to, while the power conversion operation is being performed by the power converter, change the command value in a stepwise manner and determine the deterioration of the power converter based on the mode of the change in the measurement value due to the change in the command value. Accordingly, when the mode of the change in the measurement value due to the stepwise change in the command value is acquired for deterioration determination, a difference in the mode of the change in the measurement value due to the change in the command value between the normal state and the deteriorated state becomes more remarkable as compared with a case in which the command value is slowly changed. Therefore, the difference in the mode of the change between the normal state and the deteriorated state becomes more remarkable as compared with a case in which the command value is slowly changed, and thus the deterioration can be determined more accurately.

In the aforementioned power supply device according to the first aspect, the controller is preferably configured to, while power is being supplied from the power converter to an external load, change the command value and determine the deterioration of the power converter based on the mode of the change in the measurement value due to the change in the command value. Accordingly, the deterioration can be determined without stopping the output from the power converter to the external load. Therefore, stable power can be easily continuously output from the power supply device to the external load without stopping the output to the external load in order to determine the deterioration.

The aforementioned power supply device according to the first aspect preferably further includes a bypass line that outputs power input from an outside without causing the power to pass through the power converter, and the controller is preferably configured to, while power input via the bypass line is being output to an external load without power being supplied from the power converter to the external load, change the command value and determine the deterioration of the power converter based on the mode of the change in the measurement value due to the change in the command value. The command value is changed in order to determine the deterioration, and thus at least one of the voltage or the current of the power output from the power converter changes from a normal output. Therefore, in the present invention, while the power input via the bypass line is being output to the external load without power being supplied from the power converter to the external load, the command value is changed, and the deterioration of the power converter is determined based on the mode of the change in the measurement value due to the change in the command value. Thus, the deterioration can be determined while a change in the power output to the external load to determine the deterioration is significantly reduced or prevented.

The aforementioned power supply device according to the first aspect preferably further includes an operation unit that receives an input operation performed by an inspection worker, and the controller is preferably configured to start to determine the deterioration of the power converter based on the input operation on the operation unit. Accordingly, the inspection worker can easily start the deterioration determination at the arbitrary timing of the inspection worker by performing an input operation on the operation unit.

In the aforementioned power supply device according to the first aspect, the controller is preferably configured to determine the deterioration of the power converter at predetermined time intervals. Accordingly, the deterioration can be determined periodically, and thus the continuous operation of the power converter for a long period of time in a state in which the deterioration has occurred can be significantly reduced or prevented.

The aforementioned power supply device according to the first aspect preferably further includes a display that displays information on a determination result of the deterioration of the power converter based on control by the controller. Accordingly, the inspection worker can easily recognize the information on the deterioration determination result by visually recognizing a display on the display.

A deterioration determination method of a power supply device according to a second aspect of the present invention includes changing a command value to control at least one of a voltage or a current of power output from a power converter while power conversion operation is being performed by the power converter that performs the power conversion operation to convert input power, acquiring a measurement value by measuring at least one of the voltage or the current of the power output from the power converter, and determining a deterioration of the power converter based on a mode of a change in the measurement value due to a change in the command value.

In the deterioration determination method of a power supply device according to the second aspect of the present invention, as described above, the command value is changed while the power conversion operation is being performed by the power converter. Furthermore, the deterioration of the power converter is determined based on the mode of the change in the measurement value of at least one of the voltage or the current of the power output from the power converter due to the change in the command value. Accordingly, the deterioration of the power converter is determined based on the mode of the change in the measurement value due to the change in the command value, and thus the deterioration can be determined under control of the controller that controls the power conversion operation. Therefore, the deterioration can be determined without providing a new device configuration. Consequently, it is possible to provide the deterioration determination method of a power supply device capable of determining the deterioration while significantly reducing or preventing a complex device configuration. In addition, the deterioration is determined based on the mode of the change in the measurement value due to the change in the command value, and thus it is possible to provide the deterioration determination method of a power supply device capable of determining a minor failure and deterioration in which no abnormality is observed when a constant output is performed by a constant command value without changing the command value.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a diagram for illustrating a comparison between feature amounts according to the first embodiment;

FIG. 10 is a diagram for illustrating information display of determination results according to the first embodiment;

DESCRIPTION OF THE PREFERRED EMBODIMENTS

Embodiments of the present invention are hereinafter described with reference to the drawings.

First Embodiment

The configuration of a power supply device 100 according to a first embodiment is now described with reference to FIGS. 1 to 10.

(Configuration of Power Supply Device)

Figure 1:
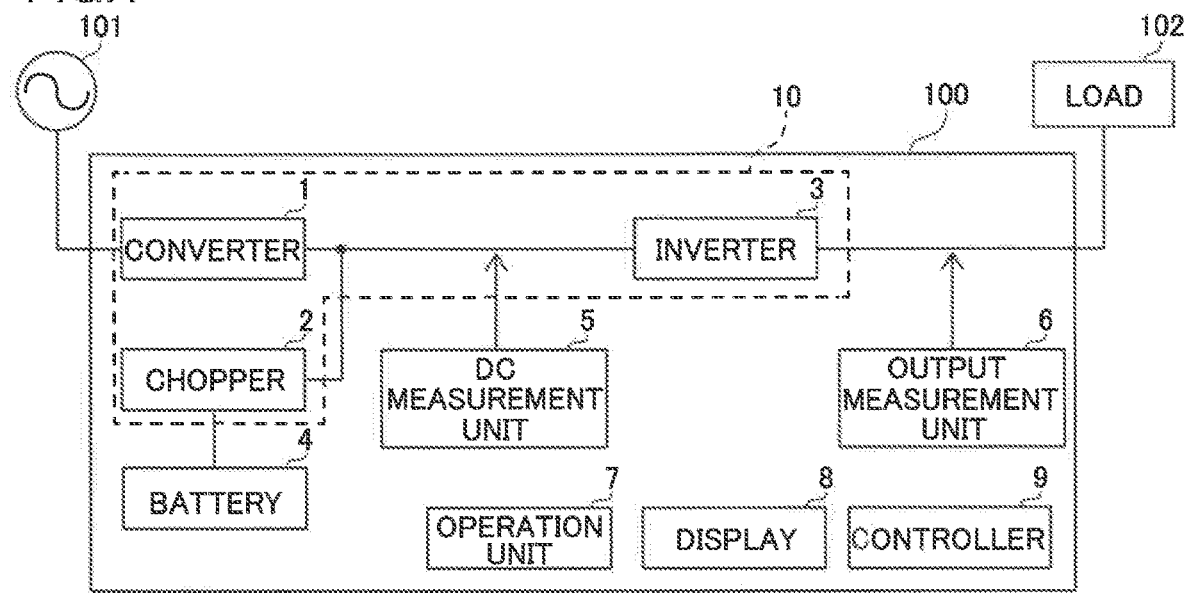
FIG. 1 is a diagram showing the overall configuration of a power supply device according to a first embodiment.

As shown in FIG. 1, the power supply device 100 according to the first embodiment is an uninterruptible power supply that outputs AC power from an external AC power supply 101 to an external load 102. The power supply device 100 includes a power converter 10 that performs power conversion operation to convert input power. The power converter 10 includes a converter 1, a chopper 2, and an inverter 3. Furthermore, the power supply device 100 includes a battery 4, a DC measurement unit 5, an output measurement unit 6, an operation unit 7, a display 8, and a controller 9. The DC measurement unit 5 and the output measurement unit 6 are examples of a "measurement unit" in the claims.

Figure 2:
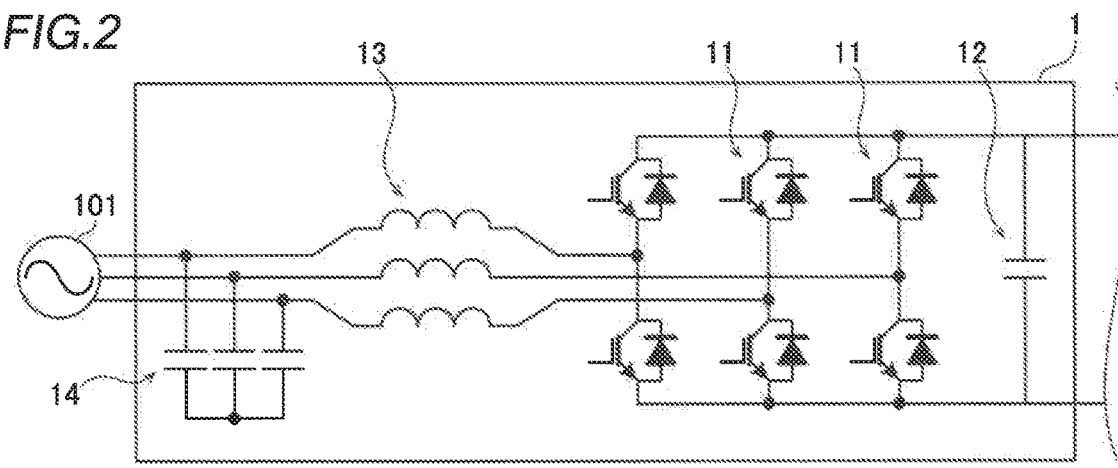
FIG. 2 is a diagram for illustrating the configuration of a converter according to the first embodiment.

As shown in FIG. 2, the converter 1 performs power conversion operation to convert AC power input from the external AC power supply 101 into DC power based on control by the controller 9. The converter 1 includes switching elements 11 that perform switching operation based on control by the controller 9. The switching elements 11 each include an insulated gate bipolar transistor (IGBT), for example. The converter 1 further includes a capacitor 12 that smooths the output DC power. The converter 1 further includes AC reactors 13 for power factor improvement. The converter 1 further includes capacitors 14 for noise filters.

Figure 3:
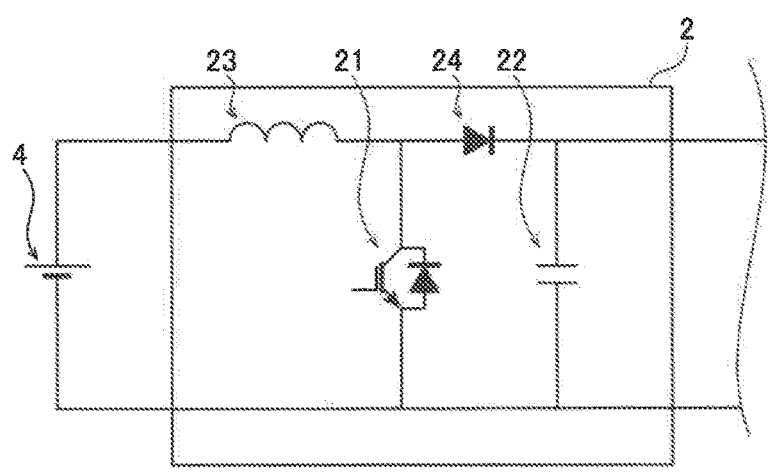
FIG. 3 is a diagram for illustrating the configuration of a chopper according to the first embodiment.

As shown in FIG. 3, the chopper 2 performs power conversion operation to convert the voltage of DC power input from the battery 4 based on control by the controller 9. The chopper 2 includes a switching element 21 that performs switching operation based on control by the controller 9. The switching element 21 includes an IGBT, for example. The chopper 2 further includes a boost chopper circuit including the switching element 21, a capacitor 22, a reactor 23, and a rectifier diode 24. The switching operation of the switching element 21 of the boost chopper circuit of the chopper 2 is controlled by the controller 9, and the chopper 2 raises and outputs the voltage of the DC power from the battery 4 based on control by the controller 9.

The battery 4 outputs DC power when the output of DC power by the converter 1 is stopped due to an abnormality in the external AC power supply 101 during a power failure, for example. The battery 4 is a lithium-ion secondary battery, for example.

Figure 4:
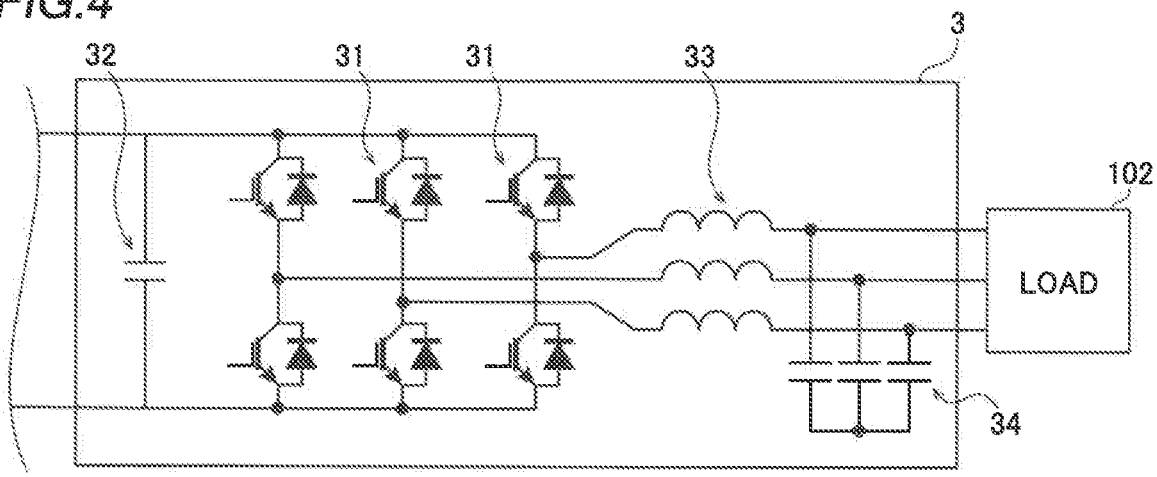
FIG. 4 is a diagram for illustrating the configuration of an inverter according to the first embodiment.

As shown in FIG. 4, the inverter 3 performs power conversion operation to convert input DC power into AC power based on control by the controller 9. The inverter 3 includes switching elements 31 that perform switching operation based on control by the controller 9. The switching elements 31 each include an IGBT, for example. The inverter 3 further includes a capacitor 32 that stabilizes the voltage of the input DC power. The capacitor 32 stabilizes the voltage by charging or discharging when the voltage of the DC power changes. The inverter 3 further includes AC reactors 33 that suppress harmonic components of the output AC power. The inverter 3 further includes capacitors 34 for noise filters.

The DC measurement unit 5 measures the voltage of the power output from the power converter 10. Specifically, the DC measurement unit 5 measures the voltages of the DC power output from the converter 1 or the chopper 2. The DC measurement unit 5 outputs, as measurement values of the measured voltages, DC voltage measurement values to the controller 9.

The output measurement unit 6 measures the voltage and current of the power output from the power converter 10. Specifically, the output measurement unit 6 measures the voltage and current of the AC power output from the inverter 3. The output measurement unit 6 outputs, as a measurement value of the measured voltage, an output voltage measurement value to the controller 9. Furthermore, the output measurement unit 6 outputs, as a measurement value of the measured current, an output current measurement value to the controller 9. The output voltage measurement value is an effective value of the voltage of the AC power measured by the output measurement unit 6. The output current measurement value is an effective value of the current of the AC power measured by the output measurement unit 6.

The operation unit 7 receives an input operation performed by an inspection worker. The operation unit 7 outputs an operation signal to the controller 9 based on the input operation performed by the inspection worker. The operation unit 7 includes a membrane switch, for example.

The display 8 displays information on the determination result of the deterioration of the power converter 10 based on control by the controller 9. That is, the display 8 displays information on the determination result of the deterioration of each of the converter 1, the chopper 2, and the inverter 3 based on control by the controller 9. The display 8 includes a liquid crystal display, for example.

Figure 5:
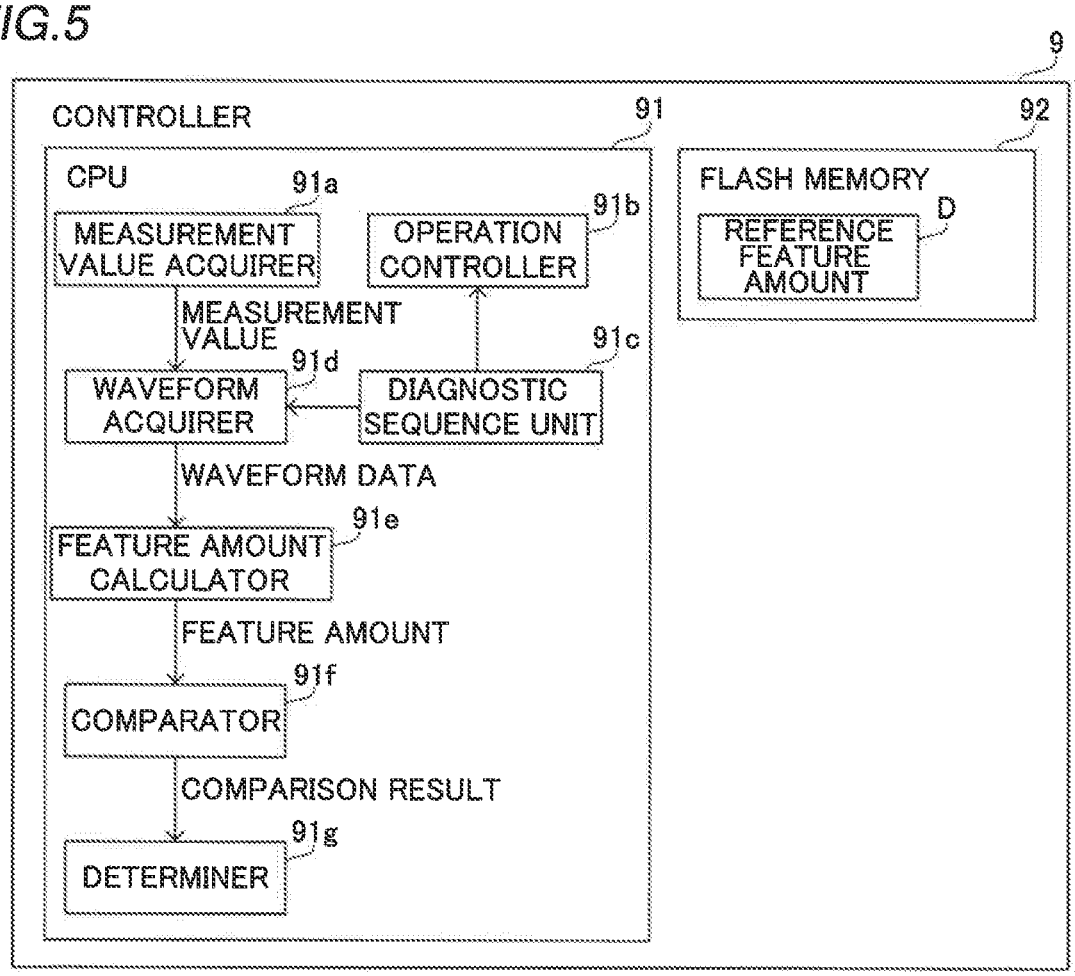
FIG. 5 is a diagram for illustrating the configuration of a controller according to the first embodiment.

The controller 9 includes a microcontroller, for example. As shown in FIG. 5, the controller 9 includes a central processing unit (CPU) 91 and a flash memory 92. The CPU 91 includes a measurement value acquirer 91a, an operation controller 91b, a diagnostic sequence unit 91c, a waveform acquirer 91d, a feature amount calculator 91e, a comparator 91f, and a determiner 91g as functional configurations. That is, the CPU 91 functions as the measurement value acquirer 91a, the operation controller 91b, the diagnostic sequence unit 91c, the waveform acquirer 91d, the feature amount calculator 91e, the comparator 91f, and the determiner 91g by executing programs. The flash memory 92 stores the programs, acquired information, etc.

(About Control by Controller)

The controller 9 controls each portion of the power supply device 100. The controller 9 controls the power conversion operation of each portion (the converter 1, the chopper 2, and the inverter 3) of the power converter 10. Furthermore, the controller 9 individually determines the deterioration of each portion (the converter 1, the chopper 2, and the inverter 3) of the power converter 10.

<About Control of Power Conversion Operation>

The measurement value acquirer 91a acquires the DC voltage measurement values, which are measurement values measured by the DC measurement unit 5. Furthermore, the measurement value acquirer 91a acquires the output voltage measurement value and the output current measurement value, which are measurement values measured by the output measurement unit 6. The measurement value acquirer 91a acquires the measurement value corresponding to each of the converter 1, the chopper 2, and the inverter 3.

The operation controller 91b controls the power conversion operation of the power converter 10 (the converter 1, the chopper 2, and the inverter 3) based on the measurement values acquired by the measurement value acquirer 91a. Specifically, the operation controller 91b outputs, to the power converter 10, a command value to control a voltage output from the power converter 10. That is, the operation controller 91b outputs a command value to each of the converter 1, the chopper 2, and the inverter 3. The command value includes a pulse width modulation (PWM) signal to control the switching operation of each of the switching elements 11, the switching element 21, and the switching elements 31 of the power converter 10 in order to cause the power converter 10 to output power of a predetermined voltage.

Specifically, the operation controller 91b controls the power conversion operation of the converter 1 based on the DC voltage measurement value acquired by the measurement value acquirer 91a. That is, the operation controller 91b controls the switching operation of the switching elements 11 of the converter 1 so as to output DC power of a voltage value corresponding to the command value from the converter 1 by outputting the command value to the converter 1. Furthermore, the operation controller 91b controls the power conversion operation of the chopper 2 based on the DC voltage measurement value acquired by the measurement value acquirer 91a. That is, the operation controller 91b controls the switching operation of the switching element 21 of the chopper 2 so as to output DC power of a voltage value corresponding to the command value from the chopper 2 by outputting the command value to the chopper 2.

The operation controller 91b controls the power conversion operation of the inverter 3 based on the output voltage measurement value acquired by the measurement value acquirer 91a. That is, the operation controller 91b controls the switching operation of the switching elements 31 of the inverter 3 so as to output AC power corresponding to the command value from the inverter 3 by outputting the command value to the inverter 3. The command value for the inverter 3 includes the effective value of the voltage of the output AC power and the frequency of the output AC power.

<About Control of Deterioration Determination>

The controller 9 individually determines the deterioration of each of the converter 1, the chopper 2, and the inverter 3 of the power converter 10. The converter 1, the chopper 2, and the inverter 3 include electronic components including the switching elements 11, the capacitor 12, the capacitors 14, and the reactors 13, electronic components including the switching element 21, the capacitor 22, and the reactor 23, and electronic components including the switching elements 31, the capacitor 32, the capacitors 34, and the reactors 33, respectively. When these electronic components deteriorate, the responsiveness of the measurement values to the command values changes. The controller 9 changes the command values and individually determines the deterioration of the power converter 10 based on modes of changes in the measurement values measured by the DC measurement unit 5 or the output measurement unit 6 due to changes in the command values, while the power conversion operation is being performed by the power converter 10. Specifically, the controller 9 individually determines the deterioration of the power converter 10 based on the states of the response waveforms (the responsiveness of the response waveforms) of the measurement values due to the changes in the command values.

The diagnostic sequence unit 91c starts to determine the deterioration of the power converter 10 based on an input operation on the operation unit 7. Specifically, the diagnostic sequence unit 91c acquires, from the operation unit 7, an operation signal to start the deterioration determination. Then, the diagnostic sequence unit 91c outputs a command to determine the deterioration of the power converter 10. The diagnostic sequence unit 91c outputs a command to individually diagnose the deterioration of each of the converter 1, the chopper 2, and the inverter 3 of the power converter 10.

For example, the diagnostic sequence unit 91c outputs a command to determine the deterioration of the converter 1 when acquiring the operation signal to start the deterioration determination. After the deterioration of the converter 1 is determined, a command is output to determine the deterioration of the chopper 2. After the deterioration of the chopper 2 is determined, a command is output to determine the deterioration of the inverter 3.

The operation controller 91b changes the command value in a stepwise manner while the power conversion operation is being performed by the power converter 10, based on the command from the diagnostic sequence unit 91c. In the first embodiment, the operation controller 91b changes the command value in a stepwise manner while power is being supplied from the power converter 10 to the external load 102. Changing the command value in a stepwise manner refers to suddenly changing the command value rather than gradually increasing or decreasing the command value.

For example, the operation controller 91b changes the command value for the converter 1 while the power conversion operation is being performed by the converter 1 when acquiring the command to determine the deterioration of the converter 1. For example, when the deterioration is determined, the operation controller 91b changes the command value from the command value in a state in which the power conversion operation is being performed to a value of 110%. Therefore, the operation controller 91b changes the command value such that the converter 1 outputs a voltage of 440 V when the converter 1 outputs DC power of a voltage of 400 V based on the command value.

When acquiring the command to determine the deterioration of the chopper 2 after determining the deterioration of the converter 1, the operation controller 91b stops the output from the converter 1 and starts the power conversion operation by the chopper 2. As in the case of the deterioration determination of the converter 1, the command value for the chopper 2 is changed while the power conversion operation is being performed by the chopper 2.

When acquiring the command to determine the deterioration of the inverter 3 after determining the deterioration of the chopper 2, the operation controller 91b changes the command value for the inverter 3 while the power conversion operation is being performed by the inverter 3. That is, the command value for the inverter 3 is changed while power is being supplied from the inverter 3 to the load 102.

Figure 6:
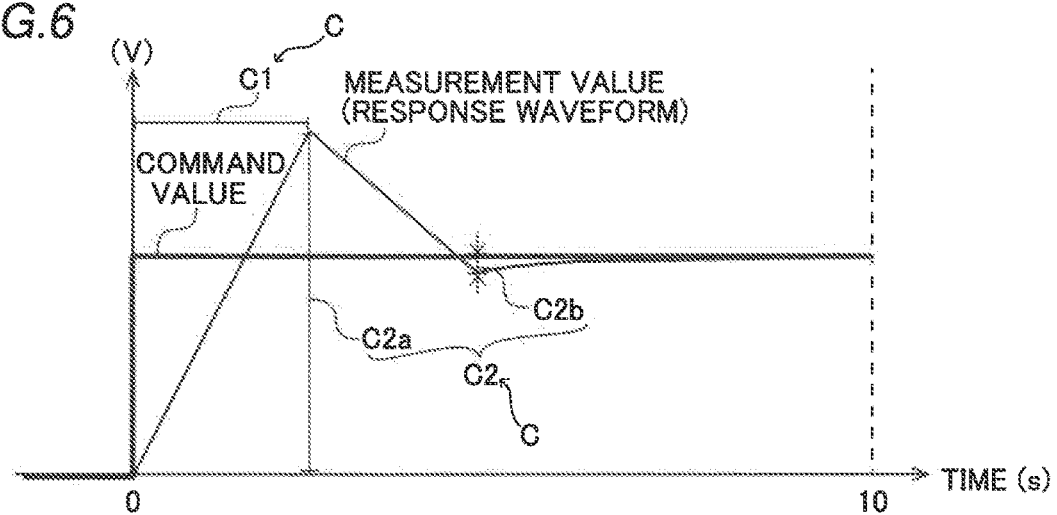
FIG. 6 is a diagram for illustrating the configuration of a normal response waveform according to the first embodiment.
Figure 7:
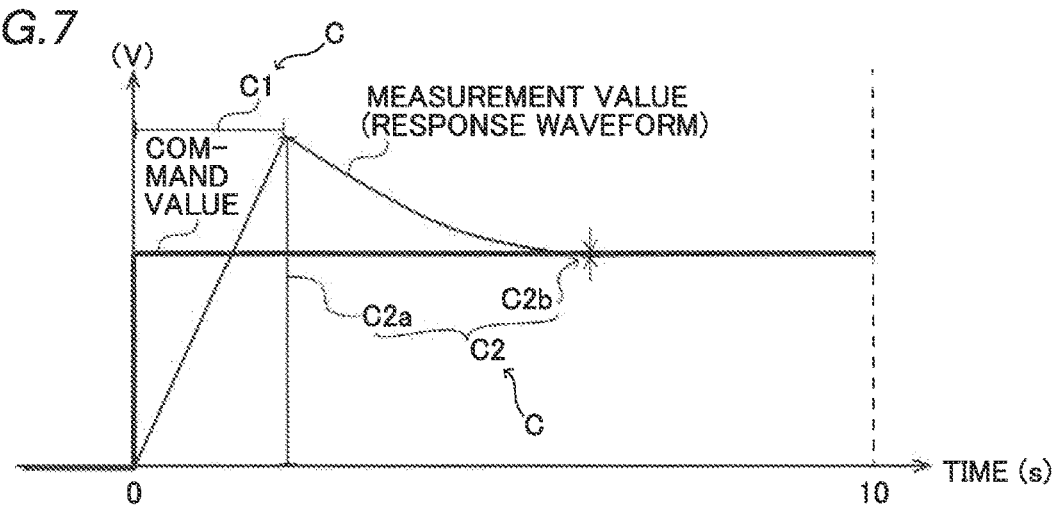
FIG. 7 is a diagram for illustrating a response waveform during deterioration of a capacitor according to the first embodiment.
Figure 8:
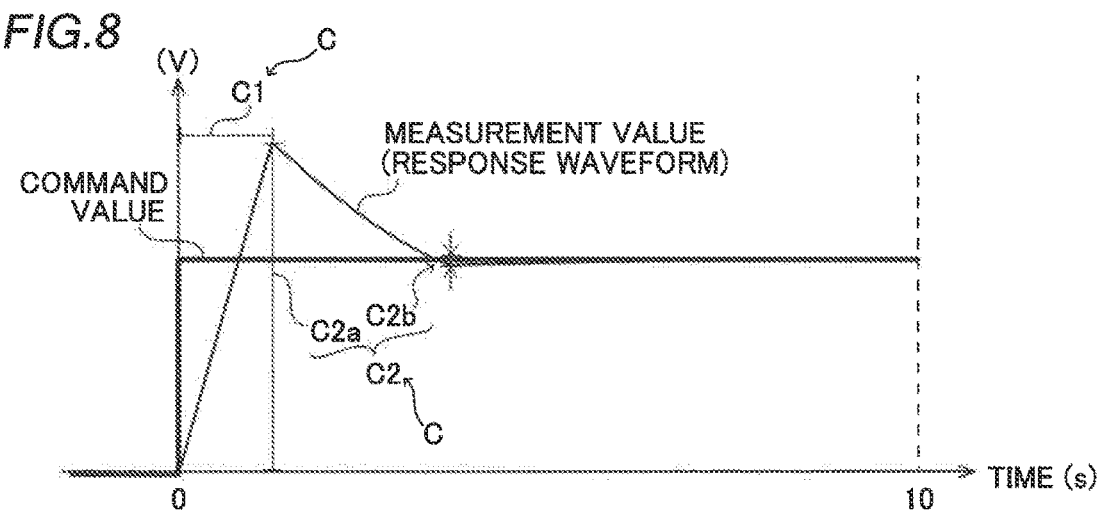
FIG. 8 is a diagram for illustrating a response waveform during deterioration of a reactor according to the first embodiment.

As shown in FIGS. 6 to 8, the waveform acquirer 91d acquires the modes of the changes in the measurement values due to the changes in the command values from the operation controller 91b based on the commands from the diagnostic sequence unit 91c. The waveform acquirer 91d acquires the states of the response waveforms of the measurement values by acquiring the measurement values acquired by the measurement value acquirer 91a in time series based on the commands from the diagnostic sequence unit 91c. For example, the waveform acquirer 91d plots measurement values acquired within 10 seconds from the timing at which the operation controller 91b changes the command values with the horizontal axis as the elapsed time and the vertical axis as the acquired measurement value to acquire the response waveforms of the measurement values.

Note that FIG. 6 is a diagram showing an example of the response waveform of the measurement value in a normal state. FIG. 7 is a diagram showing an example of the response waveform of the measurement value in a case in which the capacitor 12 (the capacitor 22 or the capacitor 32) deteriorates and the capacity is lowered. Thus, when the electronic component of the power converter 10 deteriorates, the responsiveness of the measurement value changes with the change in the command value.

As shown in FIG. 8, also when the reactor 13 (the reactor 23 or the reactor 33) of the power converter 10 deteriorates, a mode of the change in the measurement value due to the change in the command value is different from a mode of the change in the normal state. Specifically, when the reactors 13 (the reactor 23 or the reactors 33) are deteriorated as compared with the response waveform of the measurement value in the normal state, the response time C1 and the change amount C2 of the response waveform are different in value from those in the normal state, similarly to the deterioration of the capacitor 12 (the capacitor 22 or the capacitor 32).

The feature amount calculator 91e acquires the feature amount C of the mode of the change in the measurement value due to the change in the command value based on the response waveform acquired by the waveform acquirer 91d. Specifically, the feature amount calculator 91e acquires, as the feature amount C, the responsiveness of the response waveform including the response time C1 of the response waveform of the measurement value due to the change in the command value and the change amount C2 of the response waveform of the measurement value due to the change in the command value. For example, the feature amount calculator 91e acquires, as the response time C1, a value of the response time from the timing at which the command value is changed to the timing at which the change in the measurement value is maximized. Furthermore, the feature amount calculator 91e acquires, as the change amount C2, the maximum value C2a of the change amount of the measurement value due to the change in the command value and a difference value C2b between the changed command value and the measurement value changed due to the change in the command value. Specifically, the difference value C2b is a difference value between the measurement value and the command value at the timing at which the measurement value is minimized after the timing at which the change amount of the measurement value becomes the maximum value C2a.

As shown in FIG. 9, the comparator 91f compares the feature amount C of the mode (response waveform) of the change in the measurement value acquired by the feature amount calculator 91e with the reference feature amount D of a mode of a change, which becomes a reference acquired in advance. The reference feature amount D is a feature amount C acquired in advance at the time of shipment (in the normal state), for example. That is, the controller 9 acquires the reference feature amount D at the time of shipment (in the normal state) by the same control process as the feature amount C of the response waveform acquired when the deterioration is determined. In other words, at the time of shipment (in the normal state), the controller 9 changes the command value for each of the converter 1, the chopper 2, and the inverter 3 of the power converter 10 and acquires a mode of a change in the measurement value due to the change in the command value, similarly to a case in which the deterioration is determined. Then, the controller 9 acquires the feature amount C at the time of shipment (in the normal state) as the reference feature amount D by the feature amount calculator 91e, similarly to the feature amount C acquired when the deterioration is determined. Therefore, the reference feature amount D includes a reference feature amount D corresponding to each of the response time C1, the maximum value C2a of the change amount, and the difference value C2b included in the feature amount C. Furthermore, the controller 9 stores the acquired reference feature amount D in the flash memory 92.

The mode (the responsiveness of the response waveform) of the change in the measurement value due to the change in the command value changes depending on a current value (an effective value of the current) of the power output from each portion of the power converter 10. Therefore, at the time of shipment (in the normal state), the controller 9 changes the current value of the power output from the power converter 10 by 0.5 A (ampere) and acquires a reference feature amount D every 0.5 A for one feature amount C, for example. A plurality of reference feature amounts D is stored in the flash memory 92 for one feature amount C. When determining the deterioration, the comparator 91f changes the reference feature amount D based on the output current measurement value acquired by the measurement value acquirer 91a when the feature amount C is acquired. The comparator 91f compares the acquired feature amount C with the reference feature amount D changed depending on the magnitude of the current of the power output from the power converter 10. For example, when the output current measurement value acquired when the feature amount C is acquired is 0.0 A or more and less than 0.5 A, the comparator 91f compares the acquired feature amount C with the reference feature amount D acquired when the current value of the output power is 0.5 A. When the output current measurement value acquired when the feature amount C is acquired is 0.5 A or more and less than 1.0 A, the comparator 91f compares the acquired feature amount C with the reference feature amount D acquired when the current value of the output power is 1.0 A. In this manner, the comparator 91f changes the reference feature amount D every 0.5 A according to the output current measurement value acquired when the feature amount C is acquired.

The comparator 91f determines the deterioration of the power converter 10 by comparing a ratio of the acquired feature amount C to the reference feature amount D with a predetermined threshold. Specifically, a ratio of each of C1, C2a, and C2b of the acquired feature amount C to the corresponding reference feature amount D is acquired as a ratio of change. Then, the comparator 91f determines whether or not each of C1, C2a, and C2b of the feature amount C is a normal value by comparing the acquired ratio of change with the predetermined threshold. Then, the comparator 91f outputs a comparison result for each of C1, C2a, and C2b of the feature amount C. The predetermined threshold is stored in the flash memory 92 in advance. The predetermined threshold is determined according to the type of feature amount C.

The determiner 91g determines the deterioration status of each portion (the converter 1, the chopper 2, and the inverter 3) of the power converter 10 based on the comparison result from the comparator 91f. Then, the determiner 91g determines the deterioration of each portion of the power converter 10 and acquires a deterioration determination result indicating whether or not maintenance such as repair or replacement is necessary. For example, the determiner 91g acquires the determination result that the converter 1, the chopper 2, or the inverter 3 of the power converter 10 for which the feature amount C (C1, C2a, or C2b) determined to be abnormal has been acquired has deteriorated when at least one of C1, C2a, or C2b of the response waveform of the measurement value is determined to be abnormal.

As shown in FIG. 10, the determiner 91g controls the display 8 to display the information on the determination result of the deterioration of the power converter 10. The determiner 91g controls the display 8 to display the determination result of each of the converter 1, the chopper 2, and the inverter 3. Furthermore, when determining that the power converter 10 has deteriorated based on the deterioration determination, the determiner 91g provides a display for announcing the deterioration on the display 8.

(Control Process According to First Embodiment)

Figure 11:
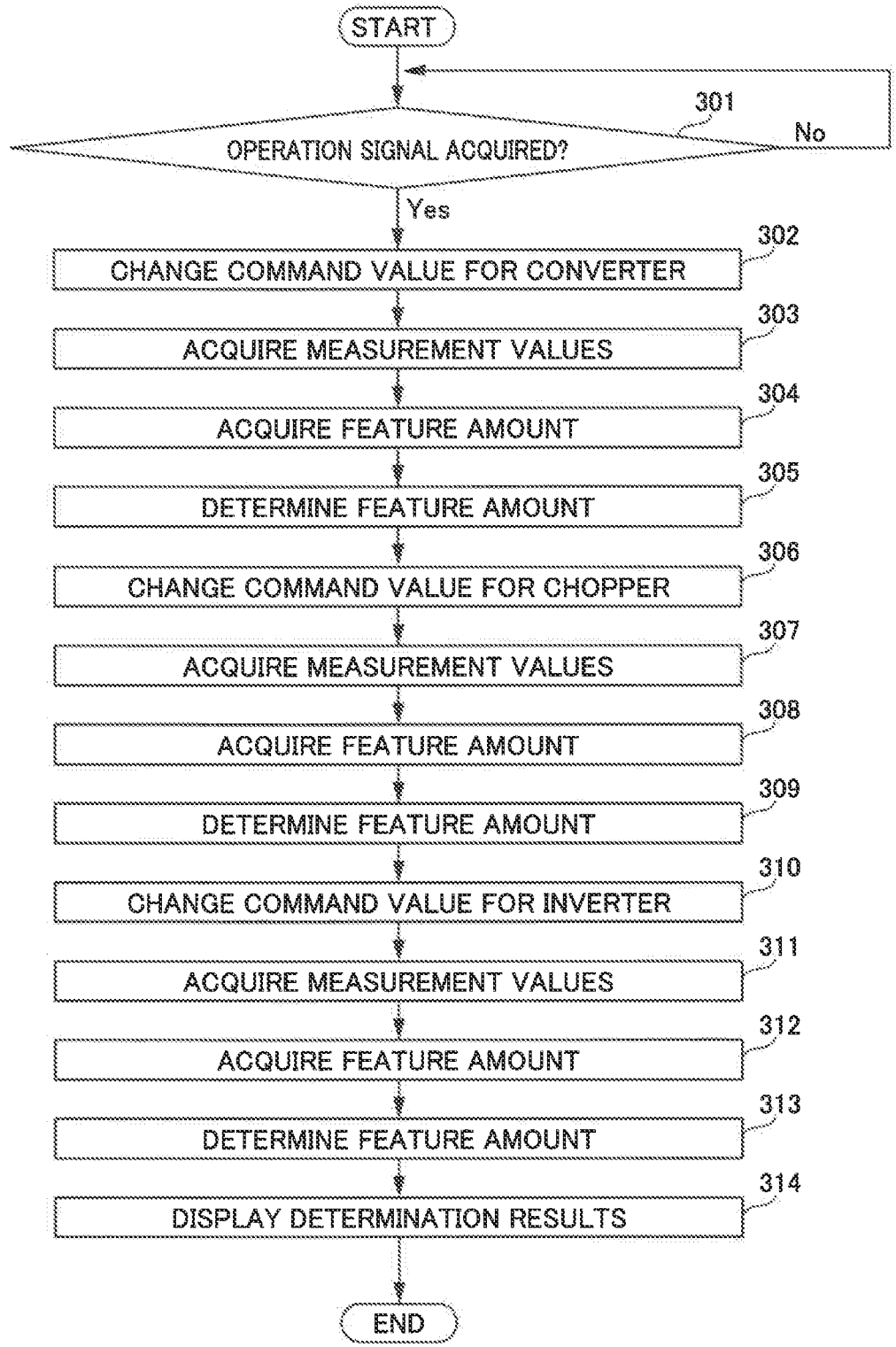
FIG. 11 is a flowchart for illustrating a deterioration determination method of the power supply device according to the first embodiment.

A control process flow of a deterioration determination method of the power supply device 100 according to the first embodiment is now described with reference to FIG. 11. Furthermore, a control of the deterioration determination method of the power supply device is performed by the controller 9.

First, in step 301, it is determined whether or not the operation unit 7 has received the operation signal to start the deterioration determination. When it is determined that the operation signal to start the deterioration determination has been received, the process advances to step 302.

In step 302, the diagnostic sequence unit 91c outputs the command to determine the deterioration of the converter 1. Then, the operation controller 91b changes the command value for the converter 1 while the power conversion operation of the converter 1 is being performed.

Then, in step 303, the measurement value acquirer 91a acquires the DC voltage measurement value and the output current measurement value for 10 seconds from the timing at which the command value for the converter 1 is changed.

Then, in step 304, the response waveform of the measurement value is acquired by the waveform acquirer 91d based on the acquired DC voltage measurement value. Then, the feature amount calculator 91e acquires the feature amount C from the acquired response waveform.

Then, in step 305, the comparator 91f acquires the corresponding reference feature amount D stored in the flash memory 92 based on the acquired output current measurement value. Then, the comparator 91f compares the acquired feature amount C with the acquired reference feature amount D. Then, the deterioration of the converter 1 is determined by the determiner 91g.

Then, in step 306, the diagnostic sequence unit 91c outputs the command to determine the deterioration of the chopper 2. Then, the operation controller 91b stops the power conversion operation of the converter 1 and starts the power conversion operation of the chopper 2. Then, the command value for the chopper 2 is changed while the power conversion operation of the chopper 2 is being performed.

Then, in step 307, the measurement value acquirer 91a acquires the DC voltage measurement value and the output current measurement value for 10 seconds from the timing at which the command value for the chopper 2 is changed.

Then, in step 308, the response waveform of the measurement value is acquired by the waveform acquirer 91d based on the acquired DC voltage measurement value. Then, the feature amount calculator 91e acquires the feature amount C from the acquired response waveform.

Then, in step 309, the comparator 91f acquires the corresponding reference feature amount D stored in the flash memory 92 based on the acquired output current measurement value. Then, the comparator 91f compares the acquired feature amount C with the acquired reference feature amount D. Then, the deterioration of the chopper 2 is determined by the determiner 91g.

Then, in step 310, the diagnostic sequence unit 91c outputs the command to determine the deterioration of the inverter 3. Then, the operation controller 91b changes the command value for the inverter 3 while the power conversion operation of the inverter 3 is being performed.

Then, in step 311, the measurement value acquirer 91a acquires the output voltage measurement value and the output current measurement value for 10 seconds from the timing at which the command value for the inverter 3 is changed.

Then, in step 312, the response waveform of the measurement value is acquired by the waveform acquirer 91d based on the acquired output voltage measurement value. Then, the feature amount calculator 91e acquires the feature amount C from the acquired response waveform.

Then, in step 313, the comparator 91f acquires the corresponding reference feature amount D stored in the flash memory 92 based on the acquired output current measurement value. Then, the comparator 91f compares the acquired feature amount C with the acquired reference feature amount D. Then, the deterioration of the inverter 3 is determined by the determiner 91g.

Then, in step 314, the information on the determination results of the deterioration of the converter 1, the chopper 2, and the inverter 3 is displayed on the display 8 by the determiner 91g.

It should be noted that any of a control of the deterioration determination of the converter 1 in step 302 to step 305, a control of the deterioration determination of the chopper 2 in step 306 to step 309, and a control of the deterioration determination of the inverter 3 in step 310 to step 313 may be performed first.

[Advantageous Effects of First Embodiment]

According to the first embodiment, the following advantageous effects are achieved.

According to the first embodiment, as described above, the command value is changed while the power conversion operation is being performed by the power converter 10. Furthermore, the deterioration of the power converter 10 is determined based on the mode of the change in the measurement value of the voltage of the power output from the power converter 10 due to the change in the command value. Accordingly, the deterioration of the power converter 10 is determined based on the mode of the change in the measurement value due to the change in the command value, and thus the deterioration can be determined under control of the controller 9 that controls the power conversion operation. Therefore, the deterioration can be determined without providing a new device configuration. Consequently, the deterioration can be determined while a complex device configuration is significantly reduced or prevented. In addition, the deterioration is determined based on the mode of the change in the measurement value due to the change in the command value, and thus it is possible to determine a minor failure and deterioration in which no abnormality is observed when a constant output is performed by a constant command value without changing the command value.

According to the first embodiment, as described above, the mode of the change in the measurement value includes the state of the response waveform of the measurement value due to the change in the command value, and the controller 9 is configured to determine the deterioration of the power converter 10 based on the state of the response waveform of the measurement value due to the change in the command value. Accordingly, the feature points of the mode of the change in the measurement value can be acquired from the shape of the response waveform, for example, based on the state of the response waveform of the measurement value due to the change in the command value. Therefore, unlike a case in which a numerical value of the measurement value at one point (pinpoint) is acquired for a mode of the change in the command value to determine the deterioration, the feature points of the mode of the change can be easily acquired based on the state of the response waveform. Consequently, the change in the measurement value due to the deterioration can be easily acquired based on the state of the response waveform of the measurement value due to the change in the command value, and thus the deterioration can be easily determined.

According to the first embodiment, as described above, the controller 9 is configured to determine the deterioration of the power converter 10 based on the responsiveness of the response waveform including at least one of the response time C1 of the response waveform of the measurement value due to the change in the command value or the change amount C2 of the measurement value in the response waveform of the measurement value due to the change in the command value. Accordingly, even when there is a minor failure or deterioration that does not appear in the output and operation of the power supply device, it is possible to determine a deterioration in which an abnormality appears in the responsiveness of the response waveform including at least one of the response time C1 of the response waveform of the measurement value or the change amount C2 of the measurement value in the response waveform. When the capacitor 12 (14, 22, 32, 34) or the reactor 13 (23, 33), for example, of the power converter 10 deteriorates, changes such as shortening of the response time C1 and a difference in the magnitude of the change amount C2 of the measurement value from the normal state appear in the responsiveness of the response waveform even when there is no change in the output value during operation. Therefore, the deterioration is determined based on the responsiveness of the response waveform such that it is possible to easily determine the minor failure and deterioration of the capacitor 12 (14, 22, 32, 34) or the reactor 13 (23, 33) of the power converter 10.

According to the first embodiment, as described above, the response time C1 of the response waveform includes the value of the response time from the timing at which the command value is changed to the timing at which the change in the measurement value is maximized. Accordingly, the response time C1 from the timing at which the command value is changed to the timing at which the change in the measurement value is maximized can be acquired as the response time C1 of the response waveform. When the capacitor 12 (14, 22, 32, 34) or the reactor 13 (23, 33), for example, of the power converter 10 deteriorates, the response time C1 from the timing at which the command value is changed to the timing at which the change in the measurement value is maximized is different in value from that in a case in which there is no deterioration. Therefore, the response time C1 from the timing at which the command value is changed to the timing at which the change in the measurement value is maximized is acquired such that the deterioration of the power converter 10 can be easily determined.

According to the first embodiment, as described above, the change amount C2 of the measurement value in the response waveform includes at least one of the maximum value C2a of the change amount of the measurement value due to the change in the command value or the difference value C2b between the changed command value and the measurement value changed due to the change in the command value. Accordingly, at least one of the maximum value C2a of the change amount of the measurement value due to the change in the command value or the difference value C2b between the changed command value and the measurement value changed due to the change in the command value can be acquired as the change amount C2 of the measurement value in the response waveform. When the capacitor 12 (14, 22, 32, 34) or the reactor 13 (23, 33), for example, of the power converter 10 deteriorates, the maximum value C2a of the change amount of the measurement value and the difference value C2b between the command value and the measurement value are different in value from those in a case in which there is no deterioration. Therefore, at least one of the maximum value C2a of the change amount of the measurement value or the difference value C2b between the command value and the measurement value is acquired such that the deterioration of the power converter 10 can be easily determined.

According to the first embodiment, as described above, the controller 9 is configured to acquire the feature amount C of the mode of the change in the measurement value based on the mode of the change in the measurement value due to the change in the command value, and determine the deterioration of the power converter 10 by comparing the acquired feature amount C of the mode of the change in the measurement value with the reference feature amount D of the mode of the change, which becomes a reference acquired in advance. Accordingly, the deterioration can be determined based on the reference feature amount D acquired in advance in the normal state without deterioration. Therefore, the acquired feature amount C is compared with the reference feature amount D such that the deterioration can be easily determined when there is an abnormality in the acquired feature amount C. Consequently, a deterioration can be easily determined when the deterioration occurs.

According to the first embodiment, as described above, the controller 9 is configured to determine the deterioration of the power converter 10 by comparing the ratio of the acquired feature amount C to the reference feature amount D with the predetermined threshold. Accordingly, even when there is a difference between the acquired feature amount C and the reference feature amount D, the predetermined threshold is set such that a difference due to a minor failure and deterioration can be discriminated from an accidental difference due to noise etc. Therefore, when the feature amount C accidentally acquired due to noise etc. is changed, it is possible to significantly reduce or prevent erroneous determination such that the change is due to deterioration. Consequently, it is possible to save time and effort required for unnecessary component replacement based on an erroneous determination result, for example.

According to the first embodiment, as described above, the controller 9 is configured to determine the deterioration of the power converter 10 by comparing the acquired feature amount C with the reference feature amount D changed depending on the magnitude of the current of the power output from the power converter 10. The acquired feature amount C may be changed depending on the magnitude of the current of the power output from the power converter 10. Therefore, as in the first embodiment, the controller 9 is configured to determine the deterioration of the power converter 10 by comparing the acquired feature amount C with the reference feature amount D changed depending on the magnitude of the current of the power output from the power converter 10 such that even when the feature amount C is changed depending on the magnitude of the current of the power output from the power converter 10, the deterioration can be accurately determined by changing the reference feature amount D so as to correspond to the change in the feature amount C.

According to the first embodiment, as described above, the power converter 10 includes the converter 1 that converts input AC power into DC power, the inverter 3 that converts input DC power into AC power, and the chopper 2 that converts the voltage of input DC power, the DC measurement unit 5 and the output measurement unit 6 (measurement unit) measure at least one of the voltage or the current of the power output from each of the converter 1, the inverter 3, and the chopper 2, and the controller 9 is configured to output the command value to each of the converter 1, the inverter 3, and the chopper 2, acquire the measurement value corresponding to each of the converter 1, the inverter 3, and the chopper 2, and individually determine the deterioration of each of the converter 1, the inverter 3, and the chopper 2. Accordingly, the deterioration can be individually determined for each of the converter 1, the inverter 3, and the chopper 2, and thus a deteriorated portion can be identified from the converter 1, the inverter 3, and the chopper 2. Therefore, it is possible to identify a deteriorated portion from the power supply device 100 and determine the deterioration, and thus it is possible to repair or replace only the portion determined to be deteriorated based on the determination result. Consequently, when repair or replacement is performed, it is possible to save time and effort required to identify a deteriorated portion. Furthermore, only a deteriorated portion can be repaired or replaced from a plurality of portions, and thus it is possible to effectively significantly reduce or prevent repair or replacement of a normal portion.

According to the first embodiment, as described above, the controller 9 is configured to, while the power conversion operation is being performed by the power converter 10, change the command value in a stepwise manner and determine the deterioration of the power converter 10 based on the mode of the change in the measurement value due to the change in the command value. Accordingly, when the mode of the change in the measurement value due to the stepwise change in the command value is acquired for deterioration determination, a difference in the mode of the change in the measurement value due to the change in the command value between the normal state and the deteriorated state becomes more remarkable as compared with a case in which the command value is slowly changed. Therefore, the difference in the mode of the change between the normal state and the deteriorated state becomes more remarkable as compared with a case in which the command value is slowly changed, and thus the deterioration can be determined more accurately.

According to the first embodiment, as described above, the controller 9 is configured to, while power is being supplied from the power converter 10 to the external load 102, change the command value and determine the deterioration of the power converter 10 based on the mode of the change in the measurement value due to the change in the command value. Accordingly, the deterioration can be determined without stopping the output from the power converter 10 to the external load 102. Therefore, stable power can be easily continuously output from the power supply device 100 to the external load 102 without stopping the output to the external load 102 in order to determine the deterioration.

According to the first embodiment, as described above, the power supply device 100 includes the operation unit 7 that receives the input operation performed by the inspection worker, and the controller 9 is configured to start to determine the deterioration of the power converter 10 based on the input operation on the operation unit 7. Accordingly, the inspection worker can easily start the deterioration determination at the arbitrary timing of the inspection worker by performing an input operation on the operation unit 7.

According to the first embodiment, as described above, the power supply device 100 further includes the display 8 that displays the information on the determination result of the deterioration of the power converter 10 based on control by the controller 9. Accordingly, the inspection worker can easily recognize the information on the deterioration determination result by visually recognizing a display on the display 8.

Second Embodiment

The configuration of a power supply device 200 according to a second embodiment is now described with reference to FIGS. 12 and 13. In the second embodiment, the deterioration of a power converter 10 is determined without power being supplied from the power converter 10 to an external load 102, unlike the first embodiment in which the deterioration of the power converter 10 is determined while power is being supplied from the power converter 10 to the external load 102. The same or similar configurations as those of the first embodiment are denoted by the same reference numerals, and description thereof is omitted.

(Configuration of Power Supply Device According to Second Embodiment)

Figure 12:
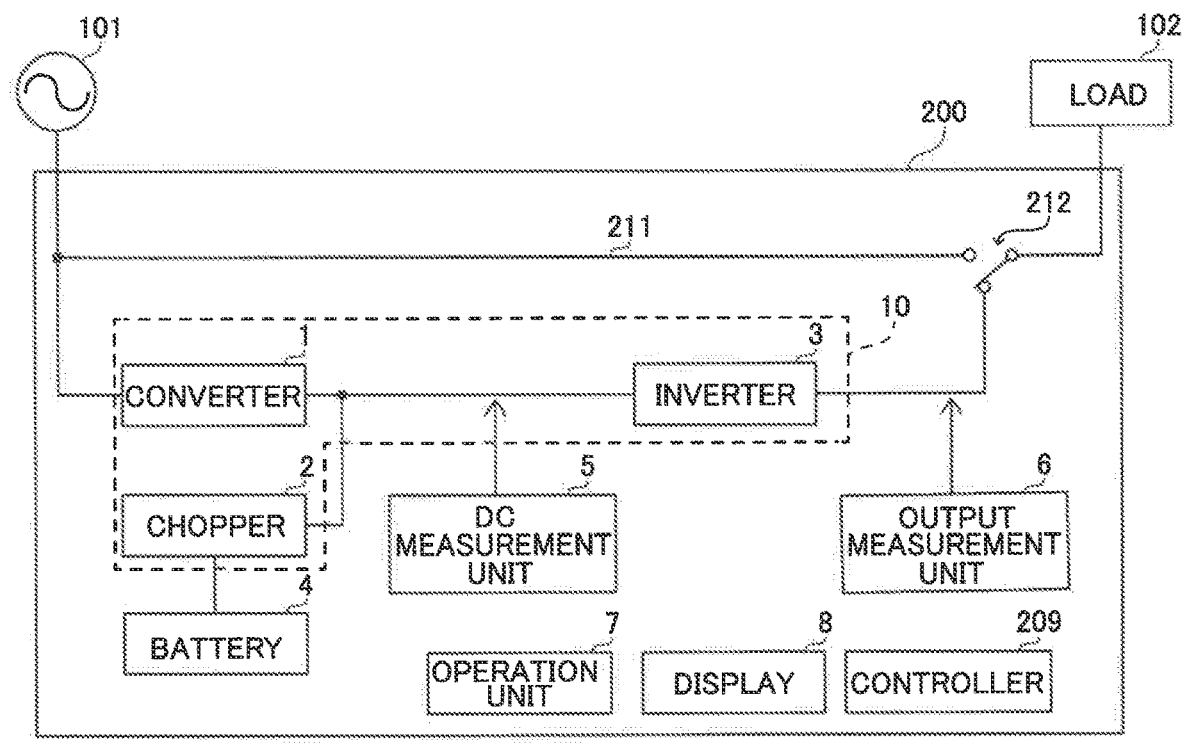
FIG. 12 is a diagram showing the overall configuration of a power supply device according to a second embodiment.
Figure 13:
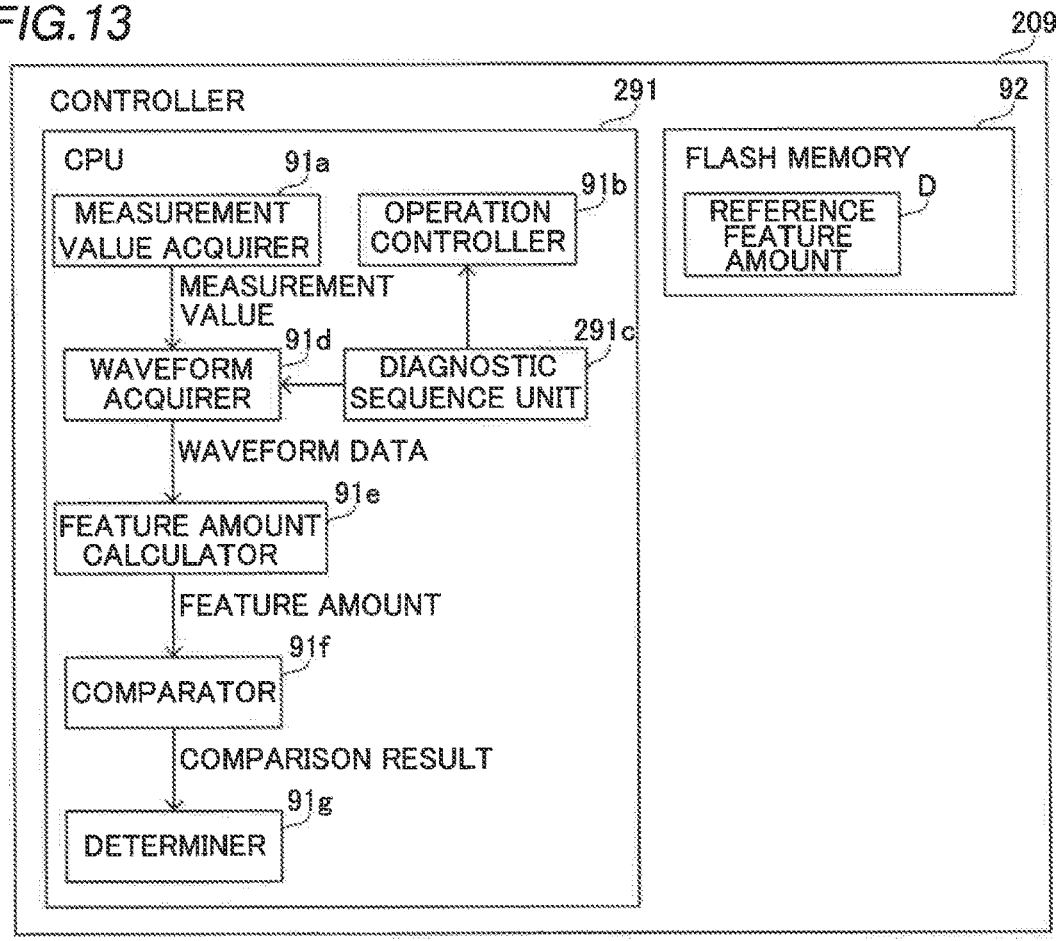
FIG. 13 is a diagram for illustrating the configuration of a controller according to the second embodiment.

As shown in FIG. 12, the power supply device 200 according to the second embodiment includes a controller 209, a bypass line 211, and a relay 212.

The bypass line 211 outputs, to the load 102, power input from an external AC power supply 101 without causing the power to pass through the power converter 10. That is, the bypass line 211 is a lead wire for directly supplying, to the external load 102, AC power input from the external AC power supply 101.

The relay 212 includes a mechanical relay that switches a connection under control of the controller 209. The relay 212 switches between supplying power from the power converter 10 to the load 102 and supplying AC power from the external AC power supply 101 to the load 102 without causing the AC power to pass through the power converter 10 by switching the connection based on a signal from the controller 209.

The controller 209 controls the operation of each portion of the power supply device 200, similarly to the controller 9 according to the first embodiment. The controller 209 includes a CPU 291, as shown in FIG. 13. The CPU 291 includes a diagnostic sequence unit 291c as a functional configuration. That is, the CPU 291 functions as the diagnostic sequence unit 291c by executing a program. The remaining configurations of the controller 209 are similar to those of the controller 9 according to the first embodiment.

In the second embodiment, the diagnostic sequence unit 291c determines the deterioration of the power converter 10 at predetermined time intervals. For example, the diagnostic sequence unit 291c periodically determines the deterioration of the power converter 10 once a month. That is, the diagnostic sequence unit 291c outputs a command to determine the deterioration of each portion (a converter 1, a chopper 2, and an inverter 3) of the power converters 10 once a month.

In the second embodiment, the diagnostic sequence unit 291c changes a command value and determines the deterioration of the power converter 10 based on a mode of a change in a measurement value due to the change in the command value, while power input via the bypass line 211 is being output to the load 102 without power being supplied from the power converter 10 to the external load 102. Specifically, the diagnostic sequence unit 291c outputs, to the relay 212, a signal to switch the connection such that AC power is supplied from the external AC power supply 101 to the load 102 without passing through the power converter 10 when determining the deterioration. Therefore, the deterioration of the power converter 10 is determined while the power input via the bypass line 211 is being output to the load 102 without power being supplied from the power converter 10 to the external load 102. A deterioration determination control process is the same as or similar to that of the first embodiment.

The deterioration of the power converter 10 is determined in a state in which the output from the power converter 10 to the load 102 is not performed, and thus a current value (an effective value of the current) of power output from each portion of the power converter 10 is constant. Therefore, unlike the first embodiment in which the reference feature amount D is changed so as to correspond to the current value of the power output from the power converter 10, in the second embodiment, an acquired feature amount C is not changed depending on the current value of the output power, and thus a reference feature amount D acquired in advance at the time of shipment (in a normal state) corresponds to one current value.

The remaining configurations of the second embodiment are similar to those of the first embodiment.

[Advantageous Effects of Second Embodiment]

According to the second embodiment, the following advantageous effects are achieved.

According to the second embodiment, as described above, the power supply device 200 includes the bypass line 211 that outputs the power input from the outside without causing the power to pass through the power converter 10, and the controller 209 is configured to, while the power input via the bypass line 211 is being output to the load 102 without power being supplied from the power converter 10 to the external load 102, change the command value and determine the deterioration of the power converter 10 based on the mode of the change in the measurement value due to the change in the command value. The command value is changed in order to determine the deterioration, and thus at least one of the voltage or the current of the power output from the power converter 10 changes from a normal output. Therefore, in the second embodiment, while the power input via the bypass line 211 is being output to the load 102 without power being supplied from the power converter 10 to the external load 102, the command value is changed, and the deterioration of the power converter 10 is determined based on the mode of the change in the measurement value due to the change in the command value. Thus, the deterioration can be determined while a change in the power output to the external load 102 to determine the deterioration is significantly reduced or prevented.

According to the second embodiment, as described above, the controller 209 is configured to determine the deterioration of the power converter 10 at the predetermined time intervals. Accordingly, the deterioration can be determined periodically, and thus the continuous operation of the power converter 10 for a long period of time in a state in which the deterioration has occurred can be significantly reduced or prevented.

The remaining advantageous effects of the second embodiment are similar to those of the first embodiment.

MODIFIED EXAMPLES

The embodiments disclosed this time must be considered as illustrative in all points and not restrictive. The scope of the present invention is not shown by the above description of the embodiments but by the scope of claims for patent, and all modifications (modified examples) within the meaning and scope equivalent to the scope of claims for patent are further included.

First Modified Example

Figure 14:
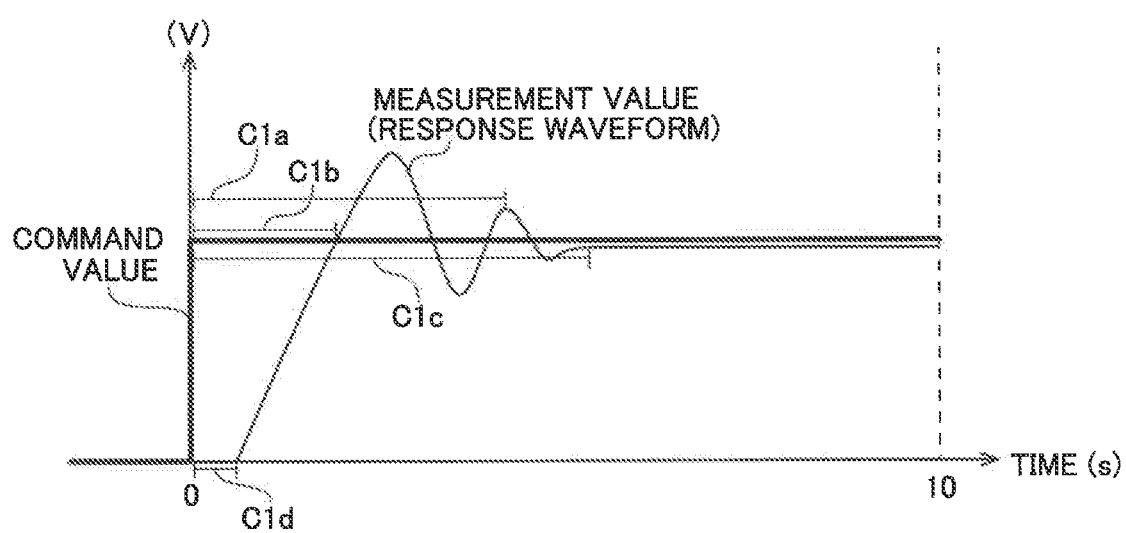
FIG. 14 is a diagram for illustrating an example of the response time of a response waveform according to a first modified example of the first and second embodiments.

For example, while the response time of the response waveform includes the value of the response time from the timing at which the command value is changed to the timing at which the change in the measurement value is maximized in each of the aforementioned first and second embodiments, the present invention is not restricted to this. For example, as in a response waveform according to a first modified example shown in FIG. 14, the response time of the response waveform may alternatively include a value C1$a$ of the response time from the timing at which the command value is changed to the timing at which the change in the measurement value becomes the second largest (local maximum). Furthermore, the response time of the response waveform may alternatively include a value C1$b$ of the response time from the timing at which the command value is changed to the timing at which the measurement value matches the command value. Moreover, the response time of the response waveform may alternatively include a value C1$c$ of the response time from the timing at which the command value is changed to the timing at which a difference between the measurement value changed due to the change in the command value and the changed command value becomes 5% or less of the change amount of the command value. That is, when the measurement value changes in a wave shape while oscillating due to the change in the command value, the value C1$c$ of the response time from the timing at which the command value is changed to the timing at which a difference between the oscillation amplitude of the measurement value and the command value becomes 5% or less of the change amount of the command value may be acquired as the response time of the response waveform. In addition, the response time of the response waveform may alternatively include a value C1$d$ of the response time from the timing at which the command value is changed to the timing at which the measurement value actually starts to change.

Other Modified Examples

While the mode of the change in the measurement value includes the state of the response waveform of the measurement value due to the change in the command value in each of the aforementioned first and second embodiments, the present invention is not restricted to this. For example, the mode of the change of the measurement value may alternatively include a numerical value (instantaneous value) measured at one point (pinpoint) of the measurement value due to the change in the command value, instead of the state of the response waveform.

While the controller is configured to determine the deterioration of the power converter based on the responsiveness of the response waveform including at least one of the response time of the response waveform of the measurement value due to the change in the command value or the change amount of the measurement value in the response waveform of the measurement value due to the change in the command value in each of the aforementioned first and second embodiments, the present invention is not restricted to this. For example, the controller may alternatively acquire the measurement value (change amount) at the time at which a predetermined time has elapsed from the timing at which the command value is changed and determine the deterioration of the power converter based on the acquired change amount, instead of the responsiveness of the response waveform.

While the change amount of the measurement value in the response waveform includes at least one of the maximum value of the change amount of the measurement value due to the change in the command value or the difference value between the changed command value and the measurement value changed due to the change in the command value in each of the aforementioned first and second embodiments, the present invention is not restricted to this. For example, the change amount of the measurement value in the response waveform may alternatively include a difference value between the maximum value of the change amount of the measurement value due to the change in the command value and the command value.

While the output measurement unit (measurement unit) acquires the effective value of the voltage of the output AC power as the voltage measurement value in each of the aforementioned first and second embodiments, the present invention is not restricted to this. For example, the output measurement unit may alternatively acquire an instantaneous value of the output AC power as the measurement value. In such a case, the controller may generate the waveform of the acquired voltage value of the AC power and acquire the distortion amount of the waveform of the voltage as the feature amount of the response waveform. Furthermore, the controller may alternatively be configured to acquire the frequency of the voltage of the output AC power as the feature amount.

While the measurement unit (the DC measurement unit and the output measurement unit) measures the voltage of the power output from each of the converter, the inverter, and the chopper in each of the aforementioned first and second embodiments, the present invention is not restricted to this. For example, the measurement unit may alternatively measure the current of the output power. Furthermore, the controller may alternatively determine the deterioration based on a measurement value of the acquired current.

While the deterioration of the power converter is determined by comparing the acquired feature amount with the reference feature amount of the mode of the change, which becomes a reference acquired at the time of shipment, in each of the aforementioned first and second embodiments, the present invention is not restricted to this. For example, the controller may alternatively be configured to acquire the reference feature amount based on the stored feature amount by storing the feature amount acquired by determining the deterioration. That is, the controller may be configured to acquire an average value of the feature amounts acquired in the deterioration determination as the reference feature amount.

While the controller is configured to determine the deterioration of the power converter by comparing the ratio of the acquired feature amount to the reference feature amount with the predetermined threshold in each of the aforementioned first and second embodiments, the present invention is not restricted to this. For example, the controller may alternatively be configured to determine the deterioration by comparing a difference between the acquired feature amount and the reference feature amount with a predetermined threshold.

While the controller is configured to determine the deterioration of the power converter by comparing the acquired feature amount with the reference feature amount changed depending on the magnitude of the current of the power output from the power converter in the aforementioned first embodiment, the present invention is not restricted to this. For example, when the deterioration of a power converter configured to output a constant current is determined, it is not necessary to change the reference feature amount depending on the magnitude of the current, and thus the controller may alternatively be configured not to change the reference feature amount depending on the magnitude of the output current. Furthermore, when the deterioration of a power converter configured to change the magnitude of the output voltage depending on the load is determined, the controller may alternatively be configured to change the reference feature amount depending on the magnitude of the output voltage.

While the controller is configured to output, to the power converter, the command value to control the voltage in each of the aforementioned first and second embodiments, the present invention is not restricted to this. The controller may alternatively be configured to output, to the power converter, a command value to control the current of the power output from the power converter. Furthermore, the controller may alternatively be configured to, when determining the deterioration of the power converter (inverter) that outputs AC power, determine the deterioration by changing a command value to control the frequency of the voltage of the output AC power.

While the power converter includes the converter that converts input AC power into DC power, the inverter that converts input DC power into AC power, and the chopper that converts the voltage of input DC power in each of the aforementioned first and second embodiments, the present invention is not restricted to this. For example, the power converter may alternatively include only the inverter that converts input DC power into AC power. That is, the power supply device may be a device that converts input DC power into AC power, such as a power conditioner for photovoltaic power generation.

While the controller is configured to change the command value in a stepwise manner and determine the deterioration of the power converter based on the mode of the change in the measurement value due to the change in the command value in each of the aforementioned first and second embodiments, the present invention is not restricted to this. For example, the controller may alternatively be configured to gradually change the command value and determine the deterioration based on the mode of the change in the measurement value due to the gradual change in the command value.

While the controller is configured to change the command value in a stepwise manner so as to raise the output voltage when determining the deterioration in each of the aforementioned first and second embodiments, the present invention is not restricted to this. For example, the controller may alternatively be configured to change the command value in a stepwise manner so as to lower the output voltage.

While the controller is configured to, while power is being supplied from the power converter to the external load, change the command value and determine the deterioration of the power converter based on the mode of the change in the measurement value due to the change in the command value in the aforementioned first embodiment, the present invention is not restricted to this. For example, the controller may alternatively be configured to determine the deterioration in a state in which the output to the external load is cut off.

While the power supply device includes the operation unit that receives the input operation performed by the inspection worker, and the controller is configured to start to determine the deterioration of the power converter based on the input operation on the operation unit in the aforementioned first embodiment, the present invention is not restricted to this. For example, the power supply device may not include the operation unit, and the controller may alternatively be configured to start the deterioration determination by recognizing the voice of the inspection worker.

While the controller is configured to determine the deterioration of the power converter at the predetermined time intervals (one month) in the aforementioned second embodiment, the present invention is not restricted to this. For example, the controller may alternatively be configured to determine the deterioration every time an integrated value (cumulative operating time) of the operating time of the power supply device reaches a predetermined time period (300 hours, for example) when the power supply device intermittently operates.

While the controller is configured to control the display to display the information on the determination result of the deterioration of the power converter in each of the aforementioned first and second embodiments, the present invention is not restricted to this. For example, a communicator may alternatively be provided such that the deterioration determination result is transmitted to the outside of the power supply device via the communicator.

While the converter includes the capacitor that smooths the output DC power in each of the aforementioned first and second embodiments, the present invention is not restricted to this. For example, the converter may alternatively include a capacitor that stabilizes DC power.

What is claimed is:
1. A power supply device comprising:
a power converter that includes at least one of a converter that converts input AC power into DC power or an inverter that converts input DC power into AC power, and that performs power conversion operation to convert input power;

a measurement unit that measures at least one of a voltage or a current of power output from the power converter; and a controller configured to output, to at least one of the converter that converts input AC power into DC power or the inverter that converts input DC power into AC power, a command value to control at least one of the voltage or the current of the power output from the power converter, and acquire a measurement value measured by the measurement unit; wherein the controller is configured to, while the power conversion operation is being performed by the power converter, change the command value and determine a deterioration of the power converter based on a mode of a change in the measurement value measured by the measurement unit due to a change in the command value.

2. The power supply device according to claim 1, wherein the mode of the change in the measurement value includes
a state of a response waveform of the measurement value due to the change in the command value; and
the controller is configured to determine the deterioration of the power converter based on the state of the response waveform of the measurement value due to the change in the command value.

3. The power supply device according to claim 2, wherein the controller is configured to determine the deterioration of the power converter based on responsiveness of the response waveform including at least one of a response time of the response waveform of the measurement value due to the change in the command value or a change amount of the measurement value in the response waveform of the measurement value due to the change in the command value.

4. The power supply device according to claim 3, wherein the response time of the response waveform includes at least one of a value of the response time from a timing at which the command value is changed to a timing at which the change in the measurement value is maximized, a value of the response time from the timing at which the command value is changed to a timing at which the change in the measurement value becomes second largest, or a value of the response time from the timing at which the command value is changed to a timing at which a difference between the measurement value changed due to the change in the command value and the changed command value becomes 5% or less of a change amount of the command value.

5. The power supply device according to claim 3, wherein the change amount of the measurement value in the response waveform includes at least one of a maximum value of the change amount of the measurement value due to the change in the command value or a difference value between the changed command value and the measurement value changed due to the change in the command value.

6. The power supply device according to claim 1, wherein the controller is configured to acquire a feature amount of the mode of the change in the measurement value based on the mode of the change in the measurement value due to the change in the command value, and determine the deterioration of the power converter by comparing the acquired feature amount of the mode of the change in the measurement value with a reference feature amount of the mode of the change, which becomes a reference acquired in advance.

7. The power supply device according to claim 6, wherein the controller is configured to determine the deterioration of the power converter by comparing a ratio of the acquired feature amount to the reference feature amount with a predetermined threshold.

8. The power supply device according to claim 6, wherein the controller is configured to determine the deterioration of the power converter by comparing the acquired feature amount with the reference feature amount changed depending on a magnitude of the current of the power output from the power converter.

9. The power supply device according to claim 1, wherein
the power converter includes the converter that converts input AC power into DC power, the inverter that converts input DC power into AC power, and a chopper that converts a voltage of input DC power;
the measurement unit measures at least one of a voltage or a current of power output from each of the converter, the inverter, and the chopper; and
the controller is configured to output the command values to each of the converter, the inverter, and the chopper, acquire the measurement values corresponding to each of the converter, the inverter, and the chopper, and individually determine a deterioration of each of the converter, the inverter, and the chopper.

10. The power supply device according to claim 1, wherein the controller is configured to, while the power conversion operation is being performed by the power converter, change the command value in a stepwise manner and determine the deterioration of the power converter based on the mode of the change in the measurement value due to the change in the command value.

11. The power supply device according to claim 1, wherein the controller is configured to, while power is being supplied from the power converter to an external load, change the command value and determine the deterioration of the power converter based on the mode of the change in the measurement value due to the change in the command value.

12. The power supply device according to claim 1, further comprising:
a bypass line that outputs power input from an outside without causing the power to pass through the power converter; wherein
the controller is configured to, while power input via the bypass line is being output to an external load without power being supplied from the power converter to the external load, change the command value and determine the deterioration of the power converter based on the mode of the change in the measurement value due to the change in the command value.

13. The power supply device according to claim 1, further comprising:
an operation unit that receives an input operation performed by an inspection worker; wherein
the controller is configured to start to determine the deterioration of the power converter based on the input operation on the operation unit.

14. The power supply device according to claim 1, wherein the controller is configured to determine the deterioration of the power converter at predetermined time intervals.

15. The power supply device according to claim 1, further comprising:
a display that displays information on a determination result of the deterioration of the power converter based on control by the controller.

16. A deterioration determination method of a power supply device, the method comprising:

changing a command value of at least one of a converter that converts input AC power into DC power or an inverter that converts input DC power into AC power to control at least one of a voltage or a current of power output from a power converter which includes at least one of the converter that converts input AC power into DC power or the inverter that converts input DC power into AC power while power conversion operation is being performed by the power converter that performs the power conversion operation to convert input power;

acquiring a measurement value by measuring at least one of the voltage or the current of the power output from the power converter; and determining a deterioration of the power converter based on a mode of a change in the measurement value due to a change in the command value.

* * * * *